United States Patent
Nguyen et al.

(10) Patent No.: US 9,431,235 B1
(45) Date of Patent: Aug. 30, 2016

(54) MULTILAYER DIELECTRIC STRUCTURES WITH GRADED COMPOSITION FOR NANO-SCALE SEMICONDUCTOR DEVICES

(71) Applicant: International Business Machines Corporation, Armonk, NY (US)

(72) Inventors: Son V. Nguyen, Schenectady, NY (US); Deepika Priyadarshini, Guilderland, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/695,705

(22) Filed: Apr. 24, 2015

(51) Int. Cl.
| | |
|---|---|
| *H01L 31/0216* | (2014.01) |
| *H01L 21/02* | (2006.01) |
| *H01L 23/528* | (2006.01) |
| *H01L 23/532* | (2006.01) |
| *H01L 29/78* | (2006.01) |
| *H01L 29/06* | (2006.01) |
| *H01L 23/48* | (2006.01) |

(52) U.S. Cl.
CPC ...... *H01L 21/02126* (2013.01); *H01L 21/0217* (2013.01); *H01L 21/0234* (2013.01); *H01L 21/02167* (2013.01); *H01L 21/02326* (2013.01); *H01L 23/481* (2013.01); *H01L 23/528* (2013.01); *H01L 23/53228* (2013.01); *H01L 23/53295* (2013.01); *H01L 29/0649* (2013.01); *H01L 29/78* (2013.01); *H01L 29/7843* (2013.01)

(58) Field of Classification Search
CPC .............. H01L 21/02126; H01L 31/02168
See application file for complete search history.

(56) References Cited

U.S. PATENT DOCUMENTS

| | | | |
|---|---|---|---|
| 6,657,284 B1 | 12/2003 | Li et al. | |
| 6,893,956 B2 | 5/2005 | Ruelke et al. | |
| 7,091,137 B2 | 8/2006 | Lee et al. | |
| 7,576,003 B2 | 8/2009 | Yang et al. | |
| 7,737,052 B2 | 6/2010 | Bhatia et al. | |
| 8,461,039 B2 | 6/2013 | Lin et al. | |
| 8,492,880 B2 | 7/2013 | Balseanu et al. | |
| 8,980,715 B2 | 3/2015 | Grill et al. | |
| 8,981,466 B2 | 3/2015 | Grill et al. | |
| 2002/0016084 A1* | 2/2002 | Todd ................. | C23C 16/30 438/791 |
| 2010/0117204 A1 | 5/2010 | Matsuoka et al. | |
| 2011/0156107 A1* | 6/2011 | Bohr ................. | H01L 21/76831 257/288 |

(Continued)

OTHER PUBLICATIONS

D. Priyadarshini et al., "Advanced Metal and Dielectric Barrier Cap Films for Cu Low k Interconnects," IEEE International Interconnect Technology Conference/Advanced Metallization Conference (IITC/AMC), May 2014, pp. 185-187.

(Continued)

*Primary Examiner* — Thomas L Dickey
(74) *Attorney, Agent, or Firm* — Steven Meyers; Ryan, Mason & Lewis, LLP

(57) ABSTRACT

Multilayer dielectric structures are provided with graded composition. For example, a multilayer dielectric structure includes a stack of dielectric films, wherein the dielectric films include at least a first SiCNO (silicon carbon nitride oxide) film and a second SiCNO film. The first SiCNO film has a first composition profile of C, N, and O atoms. The second SiCNO film has a second composition profile of C, N, and O atoms, which is different from the first composition profile of C, N, and O atoms. The composition profiles of C, N and/or O atoms of the constituent dielectric films of the multilayer dielectric structure are customized to enhance or otherwise optimize one or more electrical and/or physical properties of the multilayer dielectric structure.

15 Claims, 6 Drawing Sheets

(56) References Cited

U.S. PATENT DOCUMENTS

| | | | |
|---|---|---|---|
| 2012/0222741 A1* | 9/2012 | Davies | H01L 31/02168 136/259 |
| 2013/0333923 A1 | 12/2013 | Balseanu et al. | |
| 2014/0000686 A1* | 1/2014 | Mungekar | H01L 31/02167 136/252 |
| 2014/0252502 A1 | 9/2014 | Grill et al. | |
| 2014/0256153 A1 | 9/2014 | Grill et al. | |
| 2015/0028491 A1 | 1/2015 | Angyal et al. | |
| 2015/0194342 A1* | 7/2015 | Cao | H01L 21/76831 257/774 |

OTHER PUBLICATIONS

S.V. Nguyen et al., "Ultrathin (8-14 nm) Conformal SiN for Sub-20 nm Copper/Low k Interconnects," ECS Transactions, 2014, pp. 17-28, vol. 61, No. 3.

S. Nguyen et al., "Robust Ultrathin (20-25 nm) Trilayer Dielectric Low k Cu Damascene Cap for Sub-30 nm Nanoelectronic Devices," ECS Transactions, 2012, pp. 3-9, vol. 41, No. 43.

A. Grill et al., "Progress in the Development and Understanding of Advanced Low k and Ultralow k Dielectrics for Very Large-Scale Integrated Interconnects-State of the Art," Applied Physics Reviews, 2014, pp. 011306-1-011306-17, vol. 1, No. 1.

* cited by examiner

MULTILAYER DIELECTRIC STRUCTURES WITH GRADED COMPOSITION FOR NANO-SCALE SEMICONDUCTOR DEVICES

TECHNICAL FIELD

The field relates generally semiconductor fabrication and, in particular, to methods for fabricating multilayer dielectric films with graded composition, as well as semiconductor nano-scale devices having structures such as capping layers, liners, spacers, barrier layers, and etch stop layers, etc., which are formed of multilayer dielectric films with graded composition.

BACKGROUND

Various semiconductor integrated circuits include devices that are formed with layers of dielectric or insulating material. These dielectric/insulating layers are used as stress controlling films, barrier layers, liner layers, and capping layers, for example, for nano-devices and structures, which are fabricated using front end of line (FEOL) and back end of the line (BEOL) processes. As feature sizes and line rules become increasingly smaller, it becomes increasingly necessary to implement thinner dielectric and insulating layers with lower dielectric constants, higher voltage break down strengths, and improved leakage characteristics. Moreover, as dielectric and insulating layers are made increasingly thinner for certain applications, these dielectric and insulating layers must be able to withstand damage due to subsequent processing steps, such as damage or loss due to plasma exposures (e.g., reactive ion etch (RIE), strip, dielectric barrier etch), chemical mechanical polishing (CMP) and wet cleans (e.g., post RIE dilute hydrofluoric (DHF) cleans).

SUMMARY

Embodiments of the invention include multilayer dielectric films with graded composition. For example, one embodiment of the invention includes a semiconductor structure having a multilayer dielectric structure. The multilayer dielectric structure includes a stack of dielectric films, wherein the dielectric films include at least a first SiCNO (silicon carbon nitride oxide) film and a second SiCNO film. The first SiCNO film has a first composition profile of C, N and O atoms. The second SiCNO film has a second composition profile of C, N and O atoms, which is different from the first composition profile of C, N and O atoms.

Another embodiment includes a method for fabricating a multilayer dielectric structure. The method includes depositing a first SiCN (silicon carbon nitride) film; performing an in-situ plasma treatment process on the first SiCN film to convert the first SiCN film to a first SiCNO film having a first composition profile of C, N, and O atoms; depositing a second SiCN film; and performing an in-situ plasma treatment process on the second SiCN film to convert the second SiCN film to a second SiCNO film having a second composition profile of C, N, and O atoms, wherein the first and second composition profiles are different.

The C, N, and/or O composition profile of different dielectric films in a multilayer dielectric structure can be graded over the different dielectric films to optimize or enhance one or more electrical and/or physical properties of the multilayer dielectric structure, including, but not limited to, reducing an effective dielectric constant, increasing a wet etch resistance, enhancing an etch stop capability, enhancing diffusion barrier properties to prevent diffusion of metallic materials (e.g., copper), increasing electrical breakdown voltage and/or reducing leakage of the multilayer dielectric structure.

Other embodiments will be described in the following detailed description, which is to be read in conjunction with the accompanying drawings.

DETAILED DESCRIPTION

Embodiments of the invention will now be described in further detail with regard to methods for fabricating multilayer dielectric films with graded composition, as well as semiconductor nano-scale devices having structures such as capping layers, liners, spacers, barrier layers, and etch stop layers, etc., which are formed of multilayer dielectric films with graded composition. For example, in one embodiment of the invention, a multilayer dielectric film comprises a stack of SiCNO dielectric films, wherein two or more of the SiCNO films are formed with different composition profiles of C, N, and/or O atoms. As explained in further detail below, the different composition profiles can be achieved by varying the atomic percentages of C, N, and/or O atoms in at least two or more SiCNO layers of a multilayer dielectric structure to optimize the performance of the multilayer dielectric structure film for a target application. For example, the C, N and/or O composition profiles of dielectric films in a multilayer dielectric structure can be graded to optimize or enhance one or more electrical and/or or physical properties of the multilayer dielectric structure, including, but not limited to, reducing an effective dielectric constant k, increasing a wet etch resistance, enhancing an etch stop capability, enhancing diffusion barrier properties to prevent diffusion of metallic materials (e.g., copper), increasing electrical breakdown voltage and/or reducing leakage of the multilayer dielectric structure.

It is to be understood that the term "about" as used herein with regard to thicknesses, percentages, ranges, etc., is meant to denote being close or approximate to, but not exactly. For example, the term "about" as used herein implies that a small margin of error is present, such as 1% or less than the stated amount.

Figure 1:
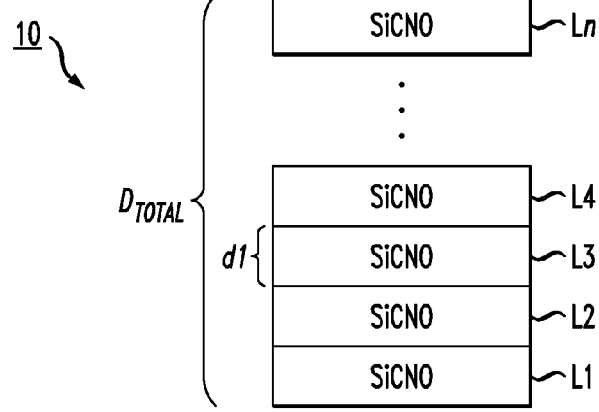
FIG. 1 shows a multilayer dielectric structure comprising a plurality of SiCNO layers, according to an embodiment of the invention.

FIG. 1 shows a multilayer dielectric structure 10 comprising a plurality of SiCNO layers, according to an embodiment of the invention. The multilayer dielectric structure 10 comprises a stack of n SiCNO layers (L1, L2, L3, L4, ..., Ln), wherein the SiCNO layers are formed with graded composition profiles of C, N, and/or O atoms. In one embodiment of the invention, each SiCNO layer has the same or similar thickness d1, and the multilayer dielectric structure 10 has a total thickness $D_{total}$. For example, in one embodiment, each SiCNO layer in the multilayer dielectric structure 10 of FIG. 1 has a thickness d1 in a range of about 1.0 nm to about 5 nm, wherein the multilayer dielectric structure 10 has an overall total thickness $D_{total}$<10 nm.

In another embodiment, one or more SiCNO layers in the multilayer dielectric structure 10 can have different thicknesses. For example, some layers can be formed with a thickness of about 1 nm and some layers can be formed with a thickness of about 2 nm, for example. By forming thinner layers of SiCNO, for example, the overall conformality of the multilayer dielectric structure 10 can be increased, and the variation in composition profile (in terms of atomic percentages of C, N, and/or O) of each SiCNO layer can be more tightly and precisely controlled using plasma treatment techniques or direct plasma chemical vapor deposition.

As will be explained in further detail below, a multilayer SiCNO dielectric structure, such as shown in FIG. 1, can be formed using standard dielectric film deposition techniques, which enable the formation of highly conformal and stress controlled multilayer ultrathin dielectric structures that are suitable for use as stressor liners (stress controlled films), barrier/liner layers, and capping layers, for example, which can be used for fabricating nano-devices in FEOL and BEOL applications. In one embodiment of the invention, each SiCNO layer in the multilayer dielectric structure 10 of FIG. 1 is formed using a cyclical process that comprises (i) depositing a thin conformal SiCN film using a plasma enhanced chemical vapor deposition (PECVD) process, and (ii) performing a modulated radio frequency (RF) plasma oxidation and/or nitridation treatment to adjust the composition profile of the C, N, and/or O atoms in the resulting SiCNO layer, and repeating each process (i) and (ii) for each dielectric film of the multilayer dielectric structure 10.

In another embodiment of the invention, a plasma chemical vapor deposition process can be performed to deposit an ultrathin SiCNO film using carbosilane or organosilicon precursors with nitrogen and oxygen reactant sources. The composition of Si, C, N and O can be varied by changing the precursors and the reactant source ratio during the deposition. This process is preferable when forming a SiCNO layer with a thickness in a range of about 5 nm to about 10 nm, wherein a change in the precursor/reactant source ratio can be performed during the SiCNO deposition process to adjust (e.g., grade) the composition of C, N and/or O atoms through a single SiCNO layer.

The composition profile of C, N, and/or O atoms of one or more SiCNO layers in the multilayer dielectric structure 10 can be varied with regard to atomic percentages of C, N, and/or O atoms so as to adjust electrical and/or physical properties of each SiCNO layer, and thereby obtain desired electrical and/or physical characteristics of the multilayer dielectric structure 10 overall. For example, increasing the atomic percentage of carbon (C) of a given SiCNO layer primarily results in (i) making the given SiCNO layer become more hydrophobic (prevent moisture absorption), and (ii) increasing the wet etch resistance of the given SiCNO layer. In addition, increasing the amount of carbon in a given SiCNO layer results in reducing a dielectric constant and increasing the diffusion barrier properties of the given SiCNO layer.

Moreover, increasing the atomic percentage of oxygen (O) of a given SiCNO layer primarily results in (i) reducing the dielectric constant of the given SiCNO layer, (ii) increasing the diffusion barrier properties (e.g., prevent copper diffusion) of the given SiCNO layer, and (iii) increasing the breakdown voltage of the given SiCNO layer. Furthermore, increasing the atomic percentage of nitrogen (N) of a given SiCNO layer primarily results in (i) increasing the adhesion properties of the given SiCNO layer (e.g., adhesion to copper metallization), (ii) increasing the breakdown voltage of the given SiCNO layer, and (iii) reducing the current leakage of the given SiCNO layer. In addition, increasing the amount of nitrogen in a given SiCNO layer results in densifying the given SiCNO layer, and changing a stress characteristic of the given SiCNO layer.

Using techniques as discussed herein, a graded composition profile of C, N and/or O atoms over the different SiCNO films of the multilayer dielectric structure 10 can be customized for a target application. For example, for liner applications, it may be desirable (i) to increase the carbon concentration of one or more SiCNO layer(s) of the multilayer liner structure to make a surface of the multilayer liner structure more hydrophobic and etch resistant, (ii) to increase the oxygen concentration of one or more middle SiCNO layers of the multilayer liner structure to reduce the effective dielectric constant of the multilayer liner structure, and (iii) to minimize the oxygen content in certain SiCNO layer(s) that form a surface of the multilayer liner structure, so as to prevent oxidation of structures that are in contact with the surface of the multilayer liner structure.

Furthermore, for BEOL applications wherein the multilayer dielectric structure 10 is used as a barrier layer or capping layer between copper metallization and an inter-level dielectric (ILD) layer, it is desirable to increase the nitrogen concentration and decrease (or substantially eliminate) the oxygen concentration of the lower SiCNO layer(s) of the multilayer dielectric structure 10, which are in contact with (or otherwise near) a metallization layer (e.g., copper). Indeed, increasing the nitrogen concentration of the lower SiCNO layer(s) of the multilayer dielectric structure 10 enhances the diffusion barrier properties of the multilayer dielectric structure 10 and enhances adhesion of the multilayer dielectric structure 10 to the metallization layer. Moreover, reducing or eliminating the oxygen concentration in the lower SiCNO layer in contact with the metallization layer prevents oxidation of the metallization layer.

Moreover, for BEOL application, it is desirable to increase the oxygen concentration in the middle and upper SiCNO layers of the multilayer dielectric structure 10, which causes a decrease in the effective dielectric constant of the multilayer dielectric structure 10 and improves adhesion between the ILD layer and the multilayer dielectric structure 10. In addition, increasing the oxygen concentration in the middle and upper SiCNO layers also serves to enhance the diffusion barrier property of the multilayer dielectric stack structure 10, which prevents diffusion of copper atoms from the metallization layer into the ILD layer.

Furthermore, for BEOL applications, it is desirable to increase the carbon concentration of the lower SiCNO layer(s) of the multilayer dielectric structure 10 (which are in contact with or near the metallization layer), which makes the lower surface of the multilayer dielectric structure 10 more hydrophobic (moisture barrier), preventing oxidation of the underlying metallization layer.

In one embodiment of the invention, a BEOL capping layer with an effective dielectric constant of about 5.5 or less, and with a total thickness of about 10 nm or less can be realized, wherein each SiCNO layer has a thickness in a range of about 1 nm to about 4 nm, and wherein the following composition profiles are implemented:

(i) an atomic percentage of oxygen (O) in the lower SiCNO layer(s) is in a range of about 0% to about 25%, and wherein an atomic percentage of oxygen (O) in the upper SiCNO layer(s) is in a range of about 5% to about 35%;

(ii) an atomic percentage of carbon (C) in the lower SiCNO layer(s) is in a range of about 10% to about 40%, and wherein an atomic percentage of carbon (C) in the upper SiCNO layer(s) is in a range of about 0% to about 30%; and (iii) an atomic percentage of nitrogen (N) in the lower and upper SiCNO layers differs in a range of about 2% to about 20%, wherein the lower SiCNO layer(s) have a greater concentration of nitrogen (N) as compared to the upper SiCNO layer(s).

Figure 2:
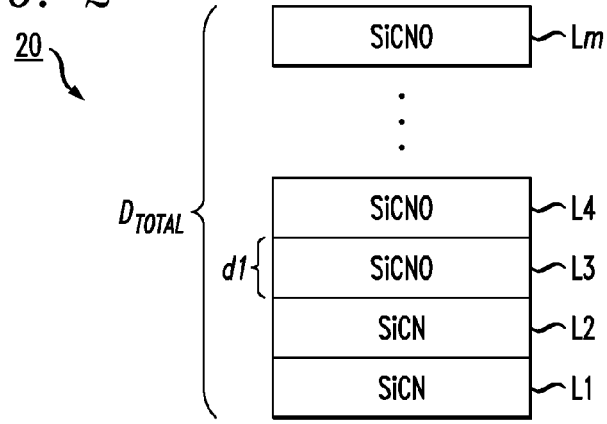
FIG. 2 shows a multilayer dielectric structure comprising a plurality of SiCNO and SiCN layers, according to another embodiment of the invention.

FIG. 2 shows a multilayer dielectric structure 20 comprising a stack of m dielectric layers (L1, L2, L3, L4, ..., Lm), which include SiCNO and SiCN layers, according to an embodiment of the invention. In particular, the multilayer dielectric structure 20 of FIG. 2 is similar to the multilayer dielectric structure 10 of FIG. 1, except that the multilayer dielectric structure 20 of FIG. 2 includes one or more SiCN dielectric layers (e.g., layers L1 and L2). One or more SiCN layers can be implemented (instead of SiCNO layers) in applications where it is desirable to have no or a very small amount of oxygen (e.g., atomic percentage of O at about 0%) in, e.g., the lower layers of the multilayer dielectric structure 20, while having the benefits afforded by thin dielectric layers with graded C and/or N composition profiles. For example, for BEOL applications, the stack structure 20 of FIG. 2 may be implemented where the lower layers L1 and L2, which are rich in carbon and nitrogen, and devoid of oxygen, are in contact with copper metallization, for example, and wherein the upper layer Lm of the stack structure 20 comprises an oxygen rich SiCNO layer to achieve good adhesion with an ILD layer, for example.

Figure 3:
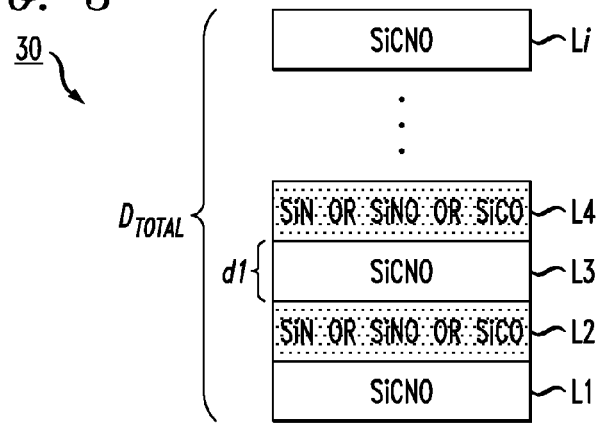
FIG. 3 shows a multilayer dielectric structure comprising a plurality of SiCNO layers and one or more other dielectric layers, according to another embodiment of the invention.

FIG. 3 shows a multilayer dielectric structure 30 comprising a stack of i dielectric layers (L1, L2, L3, L4, ..., Li), which include SiCNO layers and one or more other dielectric layers, according to another embodiment of the invention. In particular, the multilayer dielectric structure 30 of FIG. 3 is similar to the multilayer dielectric structure 10 of FIG. 1, except that the multilayer dielectric structure 30 of FIG. 3 includes one or more SiN, or SiNO, or SiCO layers (e.g., layers L2 and L4). One or more SiN or SiNO layers can be implemented (instead of SiCNO layers) in applications where it is desirable to have no or a very small amount of carbon (e.g., atomic percentage of C at about 0%) in, e.g., middle layers of the multilayer dielectric structure 30, while having the benefits afforded by thin dielectric layers with graded N and/or O composition profiles. Moreover, one or more SiCO layers can be implemented (instead of SiCNO layers) in applications where it is desirable to have no or a very small amount of nitrogen (atomic percentage of N at about 0%) in, e.g., middle layers of the multilayer dielectric structure 30, while having the benefits afforded by thin dielectric layers with graded C and/or O composition profiles.

Accordingly, the example multilayer dielectric structures 10, 20, and 30 discussed above provide different structures and techniques for varying the composition profile of C, N, and/or O atoms across multiple thin dielectric layers forming a multilayer dielectric structure to adjust various properties, such as the effective dielectric constant, of the multilayer dielectric structure. In particular, the effective dielectric constant, $k_{eff}$, of a multilayer dielectric stack is determined as follows:

$$k_{eff} = \frac{D_{total}}{\frac{D_1}{k_1} + \frac{D_2}{k_2} + \ldots + \frac{D_n}{k_n}}$$

where $D_{total}$ is the total thickness of the multilayer dielectric structure comprising n layers, wherein $D_1, D_2, \ldots, D_n$ denote the thickness of each individual layer, respectively, of n total layers, and wherein $k_1, k_2, \ldots, k_n$ denote the dielectric constant of each individual layer, respectively, of n total layers. As noted above, a multilayer dielectric structure with a total thickness of about 10 nm or less, which is formed with multiple thin dielectric layers of 1-2 nm in thickness, for example, and with graded composition profiles of C, N and/or O atoms, can be fabricated to have an effective dielectric constant $k_{eff}$ of about 5.5 or less. This is particularly useful in, e.g., BEOL structures for 7/5 nm technology nodes wherein thinner capping layers with reduced dielectric constants are needed to reduce capacitance in the BEOL structure.

Moreover, a multilayer SiCNO dielectric structure (such as shown in FIG. 1) provides various advantages over conventional dielectric films that are formed with only one or two dielectric layers using conventional PECVD deposition techniques. For example, dielectric films that are formed with conventional PECVD deposition techniques do not provide good step coverage (e.g., <50% conformality), as it is difficult to deposit 5-10 nm thick conformal dielectric films using such technologies due to the high deposition rate. In contrast, a multilayer SiCNO dielectric structure that is formed with a plurality of thin films (e.g., 1-2 nm) can provide a highly conformal dielectric structure that provides good step coverage with a conformality of about 70 percent or greater. In other words, by separately forming a plurality of ultra-thin dielectric layers, and building the multilayer dielectric structure to a desired total thickness, a better overall conformality can be achieved, as each constituent dielectric layer can be individually formed with high conformality.

In this regard, a multilayer SiCNO dielectric structure according to an embodiment of the invention is particularly useful in applications such as low temperature dielectrics stressor films for FEOL structures, copper capping layers in BEOL structures, and ultrathin spacers for nano transistor devices, as well as liner/barrier layers for shallow trench isolation structures, through-silicon via (TSV) structures, and copper damascene recess structures in BEOL structures. By way of specific example, a multilayer SiCNO dielectric structure according to an embodiment of the invention provides excellent gap filling characteristics for Cu damascene recess structures in, e.g., sub-10 nm Cu-ULK (Ultra low-k) BEOL interconnect structures.

Furthermore, a multilayer SiCNO dielectric structure can provide improved stress stability despite UV exposure, provide a good oxidation barrier when used as an ultra-thin capping layer in a BEOL application, provide high breakdown voltage, and/or minimal or no damage at the interface between a ULK inter-level dielectric layer and a SiCNO capping layer due to the low RF plasma deposition power that is used in the dielectric deposition process. Moreover, as noted above, by increasing the number of separate thin dielectric layers and interfaces within a multilayer dielectric structure with graded composition profiles, enhancements in electrical and physical properties of the multilayer dielectric structure are realized such as (i) enhanced oxidation barrier properties, (ii) reduction in pinholes; (iii) lower compressive stress (iv) increased breakdown voltage; (v) reduced leakage current; and (vi) reduced dielectric chamfering due to enhanced etch selectivity/etch stop resistance of the multilayer dielectric structure.

Figure 4A:
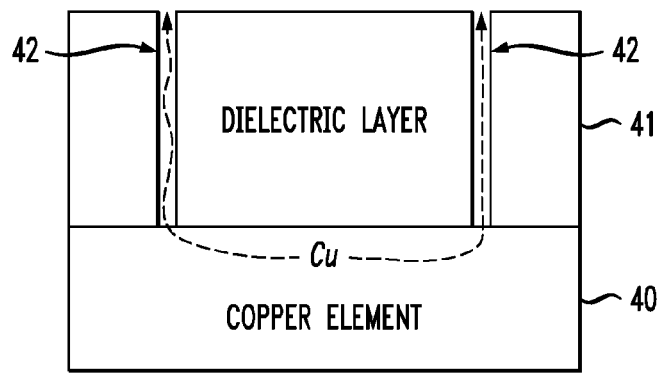
FIG. 4A schematically shows a diffusion path of copper atoms through a single dielectric layer formed on top of a copper element.
Figure 4B:
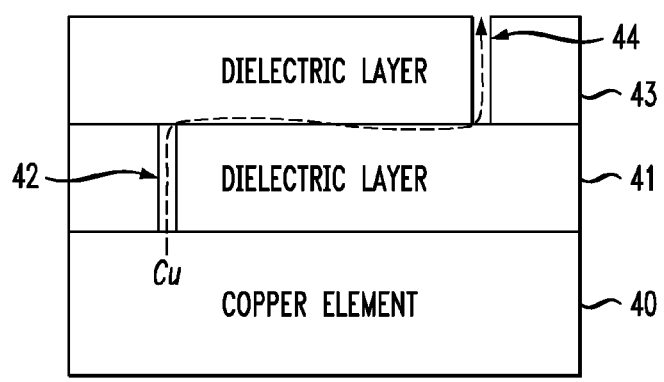
FIG. 4B schematically shows a diffusion path of copper atoms in a multilayer dielectric structure comprising two dielectric layers formed on top of a copper element.
Figure 4C:
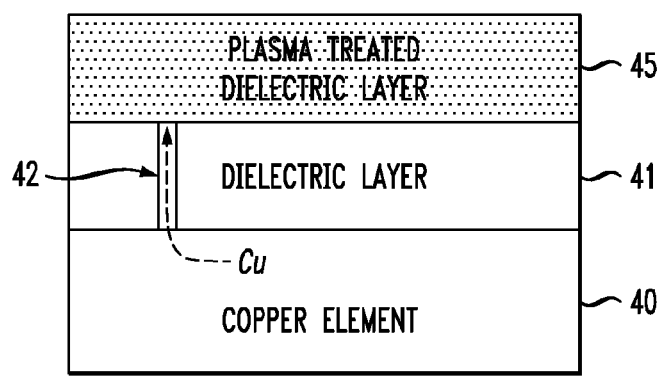
FIG. 4C schematically shows a diffusion path of copper atoms in a multilayer dielectric structure comprising at least one plasma treated dielectric layer formed on top of a copper element, according to an embodiment of the invention.

FIGS. 4A, 4B, and 4C schematically illustrate copper diffusion/oxidation pathways of different dielectric layer structures. FIG. 4A schematically shows a diffusion path of copper atoms from a copper element 40 through a single dielectric layer 41 formed on top of the copper element 40. As shown in FIG. 4A, the dielectric layer 41 comprises one or more pinhole defects 42 that extend through the dielectric layer 41, and through which copper atoms (or an external oxidant) can diffuse from the copper element 40 (or other structure) to the material of some structure formed on top of the dielectric layer 41. The single layer dielectric structure shown in FIG. 4A provides poor diffusion/oxidation barrier protection.

Further, FIG. 4B schematically shows a diffusion path of copper atoms from the copper element 40 through a multilayer dielectric structure comprising first and second conformal dielectric layers 41 and 43 formed on top of the copper element 40. While both dielectric layers 41 and 43 are shown to have pinhole defects 42 and 44, the pin holes 42 of the first dielectric layer 41 are not aligned to the pinholes 44 of the second dielectric layer 43, such that there is no straight, direct path for diffusion of copper atoms (or external oxidants) through the pinhole defects 42 and 44 in the stack of dielectric layers 41 and 43, respectively. However, the copper atoms and external oxidants can diffuse from the pinhole defect 42 of the first dielectric layer 41 to the pinhole defect 44 of the second dielectric layer 43 along an interface between the first and second dielectric layers 41 and 43. As compared to the structure of FIG. 4A, however, the structure of FIG. 4B provides improved Cu diffusion and oxidation barrier protection.

Further, FIG. 4C schematically shows a diffusion path of copper atoms from the copper element 40 through a multilayer dielectric structure comprising a conformal dielectric layer 41 and a conformal plasma treated dielectric layer 45 formed on top of the copper element 40. While the dielectric layer 41 is shown to have pinhole defects 42, the plasma treated dielectric layer 45 does not have pinhole defects, as a plasma treatment process (e.g., plasma oxidation process) that is used to change a composition profile (e.g., C, N and/or O concentration profile) of the dielectric layer 45 (as will be discussed in further detail below with reference to FIG. 5, for example) serves to reduce or eliminate such pinholes. Indeed, while copper atoms and external oxidants can diffuse from through the pinhole defect 42 of the dielectric layer 41, the plasma treated dielectric layer 45 provides an effective barrier to prevent further diffusion through the dielectric stack 41/45 due to the absence of pinhole defects in the plasma treated dielectric layer 45. Thus, as compared to the structures of FIGS. 4A and 4B, the structure of FIG. 4C provides enhanced Cu diffusion and oxidation barrier protection.

Figure 5:
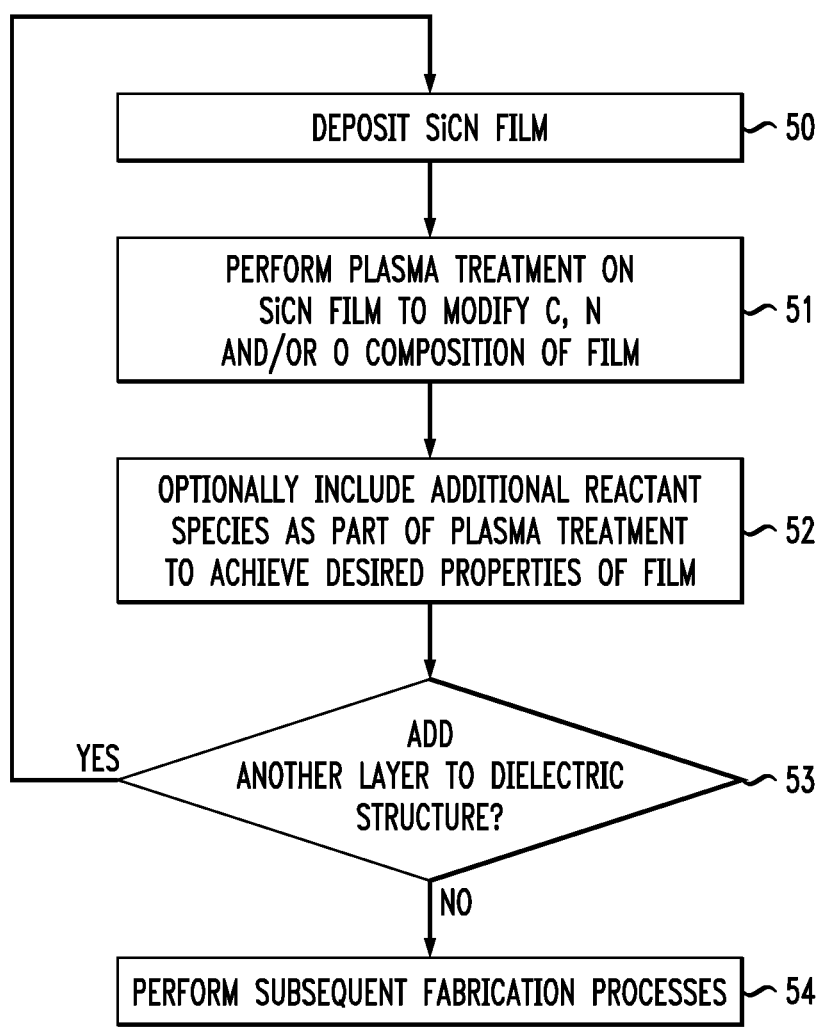
FIG. 5 is a flow diagram of a method for fabricating a multilayer dielectric structure, according to an embodiment of the invention.

FIG. 5 is a flow diagram of a method for fabricating a multilayer dielectric structure, according to an embodiment of the invention. In particular, FIG. 5 illustrates a method for fabricating a multilayer SiCNO dielectric structure such as shown in FIG. 1, wherein the SiCNO films are formed to have graded composition profiles (e.g., different atomic percentages) of O, C, and/or N atoms. The process begins with an initial step of depositing a SiCN film (step 50).

Various techniques can be implemented to deposit thin conformal stoichiometric SiCN ($SiC_xN_y$) films. For example, in one embodiment of the invention, the deposition of a conformal SiCN dielectric film (or hydrogenated silicon carbon nitride ($SiC_xN_y$:H) film) is performed using a low frequency RF plasma enhanced chemical vapor deposition (RF-PECVD) process, wherein ammonia ($NH_3$) and tetramethylsilane (TMS) are used as precursors.

In another embodiment of the invention, a conformal SiCN dielectric film can be deposited using an RF-PECVD method with a gas mixture of silane (SiH4), methane (CH4), and nitrogen (N2). The use of gas mixtures allows for varying the concentration of the elements needed for synthesizing the SiCN film and thereby optimizing the composition of the deposited SiCN film with regard to, e.g., the atomic percentages of carbon and nitrogen contained in the deposited SiCN film. When forming a SiCN film, known techniques may be applied to remove traces of oxygen from the base gas mixture before entering the PECVD reaction chamber. In this manner, the stoichiometry of the deposited SiCN film can be controlled by various deposition parameters such as the flow rates and concentration of the reactant gases, the temperature and pressure of the deposition environment, the RF power and the IF frequency used for the deposition process, etc. Moreover, the deposition time is controlled to obtain a desired SiCN film thickness. In other embodiments of the invention, a SiCN film can be formed using plasma enhanced atomic layer deposition (PEALD) or other suitable chemical or physical vapor deposition techniques.

Next, an in-situ plasma treatment process is performed on the deposited SiCN film to modify the C, N, and/or O composition of the SiCN film (step 51). The type of plasma treatment process that is implemented at this stage will depend on the target C/N/O profile for the current SiCN layer. For example, in one embodiment of the invention, a plasma oxidation process can be performed using an oxygen bearing reactant gas (precursor) such as nitrous oxide ($N_2O$), oxygen ($O_2$), ozone ($O_3$), ethanol ($C_2H_5OH$), carbon dioxide ($CO_2$), or carbon monoxide (CO), for example, along with an inert gas such as Argon (Ar) or Helium (He).

The plasma oxidation process can be implemented using PEVCD or PEALD, wherein the RF power and other plasma treatment conditions can be varied to effectively oxidize the SiCN film to form a SiCNO film. In the plasma oxidation process, a target amount of C and/or N atoms of the SiCN film are replaced or otherwise substituted with oxygen atoms to form the SiCNO film. The amount of oxidation (increase in oxygen atoms) of the SiCN film and resulting decrease in the amount of C and/or N will depend on the process conditions of the plasma treatment. As noted above, oxidation of the SiCN film creates a SiCNO film having a reduced dielectric constant, increased breakdown voltage, as well as enhanced diffusion barrier properties.

In another embodiment, a plasma nitridation process can be performed (in step 51) instead of, or in addition to, the plasma oxidation process, to increase the amount of nitrogen in the SiCN or SiCNO film. For example, in one embodiment, plasma nitridation is performed via a PEVCD or PEALD process using a nitrogen bearing reactant gas such as $N_2$ or $NH_3$, along with an inert gas such as Argon (Ar) or Helium (He). The plasma nitridation process serves to make the thin SiCN film or SiCNO film more dense by low energy plasma ion bombardment, and to change a stress characteristic of the film (compressive↔tensile). Moreover, the plasma nitridation process can serve to enhance other electrical or physical properties of the thin SiCN or SiCNO film as noted above, such as increased adhesion to metallization, and increased breakdown voltage, and reduced current leakage.

In another embodiment, an additional reactant species can be optionally included as part of the plasma treatment process to achieve other desired properties of the resulting SiCNO layer (step 52). For example, a SiCN or SiCNO film composition can be modified, or varied or improved by changing the band gap of the film, or other electronic and mechanical properties. In one embodiment, this can be done during the plasma surface treatment steps where one or more of Phosphorus (P), Fluorine (F), Boron (B), or Carbon (C) bearing reactants can be used as reactive treatment gases to modify the composition of the SiCN or SiCNO film by inserting P, F, B, and/or C atoms into the film to achieve desirable film properties.

If another layer of SiCN or SiCNO is to be added to the multilayer dielectric structure (affirmative determination in step 53), then the process of steps 50 and 51 (and optionally 52) are performed for each SiCN layer or SiCNO to be added to the multilayer dielectric structure. Once fabrication of the multilayer dielectric structure is complete and no other SiCN or SiCNO layers are to be added (negative determination in step 53), subsequent fabrication processes are performed to complete construction of the target semiconductor structure being formed. For instance, if the multilayer dielectric structure is a liner layer in a shallow trench isolation structure or a capping layer of a BEOL wiring structure, subsequent processing steps would include performing a trench fill process or depositing an ILD layer, such as will be discussed with reference to semiconductor structures shown in FIGS. 8 and 9, for example.

In another embodiment of the invention, a multilayer dielectric layer such as shown in FIG. 3 can be fabricated using a method similar to that of FIG. 5. However, at one or more cyclical stages of the fabrication process, a SiNO, SiN or SiCO film would be deposited (in step 50), wherein a suitable plasma oxidation or nitridation process would be used (in step 51) to plasma treat the SiNO, SiN or SiCO layer to achieve a desired C, N and/or O composition profile for the given film, as desired.

Figure 6:
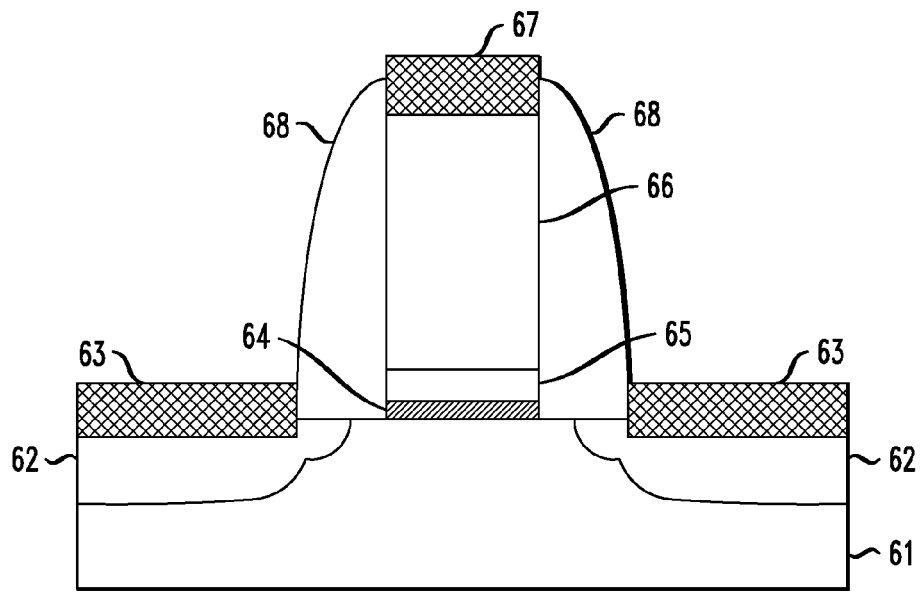
FIG. 6 is a schematic side-view of a transistor device having a spacer element that is formed of a multilayer dielectric structure according to an embodiment of the invention.

As noted above, a multilayer SiCNO dielectric structure according to an embodiment of the invention can be used in various nano-device structures as capping layers, liners, spacer barrier layers, and etch stop layers, etc., in BEOL and FEOL applications. For example, FIG. 6 is a schematic side-view of a transistor device having a spacer element that is formed of a multilayer dielectric structure according to an embodiment of the invention. In particular, FIG. 6 shows a field effect transistor 60 comprising a substrate 61, source/drain electrodes each comprising a doped region 62 and a silicide contact 63. The field effect transistor 60 further comprises a gate stack structure comprising an insulating layer 64 (or gate dielectric layer) formed on the substrate 61, and a gate electrode comprising a metallic layer 65 formed on the insulating layer 64, a polysilicon layer 66 formed on the gate metal layer 65, and a silicide contact 67 (or polycide contact) formed on the polysilicon layer 66. The gate structure is surrounded by an insulating sidewall spacer 68. In accordance with an embodiment of the invention, the insulating sidewall spacer 68 can be a multilayer dielectric structure comprising only SiCNO layers, or multiple SiCNO layers with one or more of SiCN, or SiN, or SiNO, or SiCO layers, for example, which is formed (using techniques as discussed above with reference to FIG. 5) as part of a FEOL fabrication process for FETs.

Figure 7:
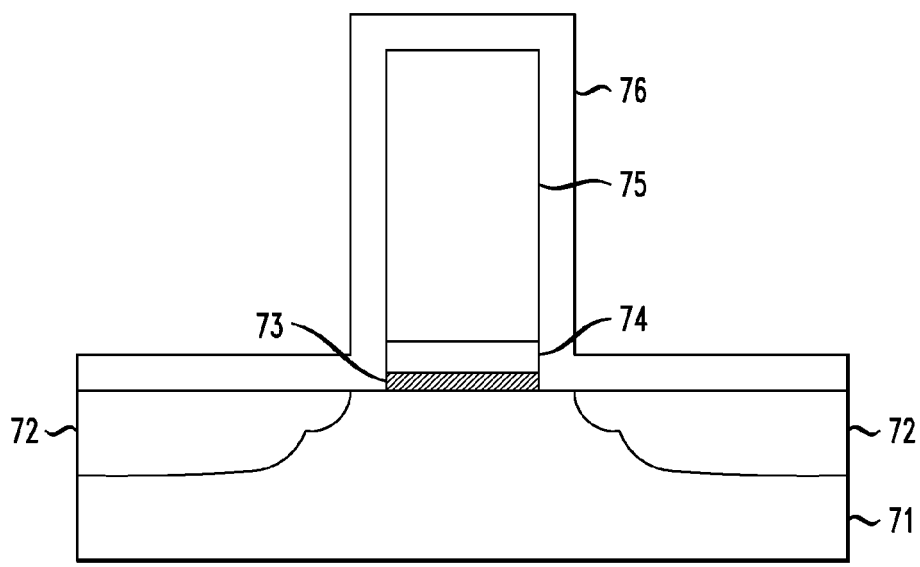
FIG. 7 is a schematic side-view of a transistor device having stress liner that is formed of a multilayer dielectric structure according to an embodiment of the invention.

FIG. 7 is a schematic side-view of a transistor device having stress liner that is formed of a multilayer dielectric structure according to an embodiment of the invention. In particular, FIG. 7 shows a field effect transistor 70 comprising a substrate 71 with doped source/drain regions 72. The field effect transistor 70 further comprises a gate stack structure comprising an insulating layer 73 (or gate dielectric layer) formed on the substrate 71, and a gate electrode comprising a metallic layer 74 formed on the insulating layer 73, and a polysilicon layer 75 formed on the gate metal layer 74. The field effect transistor 70 further comprises a stress-imparting dielectric structure 76 that is conformally formed over the FET device 70 to impart a stress thereto for enhancing the conductivity of a transistor, for example, an NFET or a PFET device. As is known in the art, SiN is one material, among others, which can be deposited in such way that the resulting material layer imparts either a tensile stress or a compressive stress to a layer of material with which it is in contact. To improve the conductivity of both an NFET and a PFET, a tensile stress-imparting dielectric structure 76 can be formed to cover an NFET device region and a compressive stress-imparting dielectric structure 76 can be formed to cover a PFET device region. In accordance with an embodiment of the invention, the stress-imparting dielectric structure 76 can be a multilayer dielectric structure comprising only SiCNO layers, or multiple SiCNO layers with one or more of SiCN, or SiN, or SiNO, or SiCO layers, for example, which is formed (using techniques as discussed above with reference to FIG. 5) as part of a FEOL fabrication process for FETs.

Figure 8:
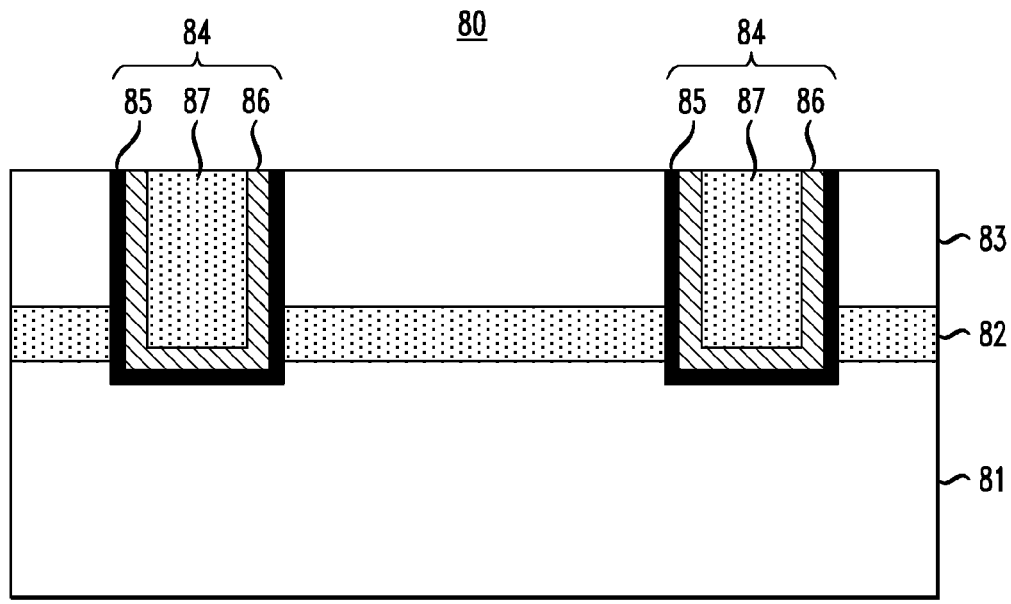
FIG. 8 is a schematic side-view of shallow trench isolation structures having a liner/barrier layer that is formed of a multilayer dielectric structure according to an embodiment of the invention.

FIG. 8 is a schematic side-view of shallow trench isolation structures having a liner/barrier layer that is formed of a multilayer dielectric structure according to an embodiment of the invention. In particular, FIG. 8 shows a semiconductor structure 80 comprising a silicon-on-insulator (SOI) semiconductor substrate comprising a first silicon layer 81, an insulating layer 82 (e.g., oxide layer) and a second silicon layer 83. FIG. 8 further shows a plurality of shallow trench isolation (STI) structures 84, which are formed between active areas in which electrical devices such as transistors or memory cells are to be formed. Each STI structure 84 comprises a trench that is formed through substrate layers 83 and 82 down to an upper portion of the first silicon layer 81, a barrier/insulating layer 85/86 lining the sidewalls and bottom walls of each trench, and an oxide fill 87 (e.g., HDPCVD oxide) filling the trench. In accordance with an embodiment of the invention, the barrier/insulating layer 85/86 that lines the trenches of the STI structures 84 can be a multilayer dielectric structure comprising only SiCNO layers, or multiple SiCNO layers with one or more of SiCN, or SiN, or SiNO, or SiCO layers, for example, which is formed (using techniques as discussed above with reference to FIG. 5) as part of a FEOL fabrication process used to fabricate STI structures.

Figure 9:
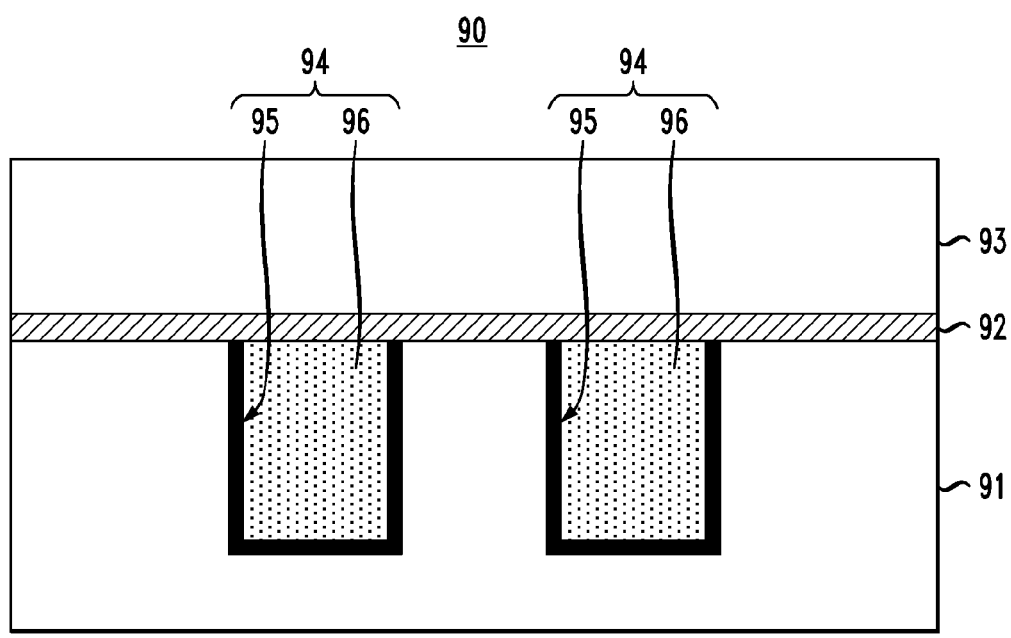
FIG. 9 is a schematic side-view of a BEOL structure having copper damascene wiring formed in an inter-level dielectric layer with a conformal capping layer formed over the inter-level dielectric layer and an exposed surface regions of the copper damascene wiring, wherein the capping layer is formed of a multilayer dielectric structure according to an embodiment of the invention.

FIG. 9 is a schematic side-view of a BEOL structure having copper damascene wiring formed in an inter-level dielectric layer with a conformal capping layer formed over the inter-level dielectric layer and an exposed surface regions of the copper damascene wiring, wherein the capping layer is formed of a multilayer dielectric structure according to an embodiment of the invention. In particular, FIG. 9 shows a BEOL structure 90 comprising a first inter-level dielectric layer 91, a capping layer 92, a second inter-level dielectric layer 93, and plurality of wiring structures 94 formed in the first inter-level dielectric layer 91. Each wiring structure 94 comprises a trench that is formed in an upper portion of the first inter-level dielectric layer 91, a barrier/insulating layer 95 lining the sidewalls and bottom walls of each trench, and a metallic material 96 (e.g., copper) filling the trench to form electrical wiring which forms a portion of a BEOL interconnect network.

In accordance with an embodiment of the invention, the capping layer 92 can be a multilayer dielectric structure comprising only SiCNO layers, or multiple SiCNO layers with one or more of SiCN, or SiN, or SiNO, or SiCO layers, for example, which is formed (using techniques as discussed above with reference to FIG. 5) as part of a BEOL fabrication process to fabricate BEOL wiring structures. The capping layer 92 is employed on the top surface of the inter-level dielectric layer 91 (e.g., a low-k dielectric layer) to prevent the diffusion of Cu atoms from the copper wire 96 into the dielectric layer 93, or otherwise employed as a barrier layer to prevent oxidation of the copper wiring 96.

Figure 10:
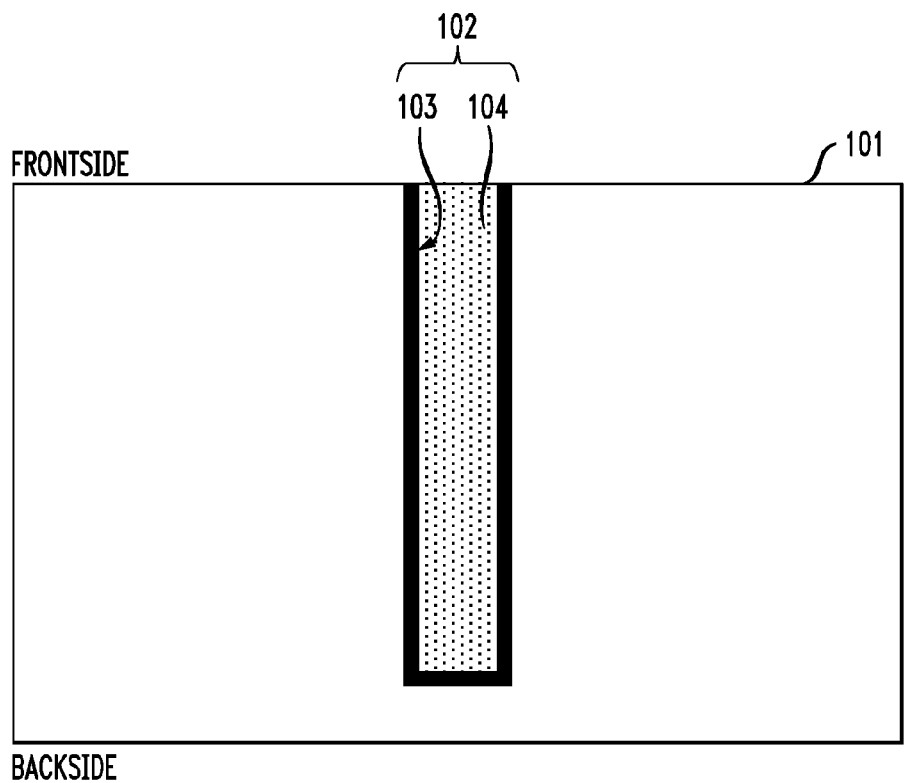
FIG. 10 is a schematic side-view of semiconductor substrate having a through silicon via with a barrier/liner layer formed of a multilayer dielectric structure according to an embodiment of the invention.

FIG. 10 is a schematic side-view of semiconductor substrate having a through silicon via with a barrier/liner layer formed of a multilayer dielectric structure according to an embodiment of the invention. In particular, FIG. 10 shows a semiconductor structure 100 comprising a semiconductor substrate 101 having a "backside" (inactive surface) and a "front side" (active surface), with a through-silicon via (TSV) structure 102 formed in the semiconductor substrate 101 from the front side to the backside. The TSV structure 102 comprises a deep trench structure formed by an anisotropic deep reactive-ion etch (DRIE) process, a conformal liner layer 103 lining the sidewall and bottom wall of the deep trench, and a copper material 104 filling the deep trench (e.g., filled with electroplated copper). The liner layer 103 electrically insulates the TSV structure 102 from the substrate 101 and prevents Cu diffusion into the silicon substrate 101. Once the TSV structure 102 shown in FIG. 10 is formed, a backside process is performed to grind down the backside of the silicon substrate 101 and expose the bottom portion of the TSV structure 102, followed by further processing steps to build structures that enable connection to the backside end of the TSV structure 102.

In accordance with an embodiment of the invention, the liner 103 can be a multilayer dielectric structure comprising only SiCNO layers, or multiple SiCNO layers with one or more of SiCN, or SiN, or SiNO, or SiCO layers, for example, which is formed (using techniques as discussed above with reference to FIG. 5) as part of a TSV fabrication process to fabricate the TSV structure 102.

It is to be understood that the invention is not limited to the particular materials, features, and structures specifically shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. However, one of ordinary skill in the art will readily recognize those features omitted from these generalized descriptions.

Further embodiments of the invention include integrated circuits with various analog and digital circuitry. In particular, integrated circuit dies can be fabricated having semiconductor structures and devices such as a field-effect transistors, bipolar transistors, metal-oxide-semiconductor transistors, diodes, resistors, capacitors, inductors, etc., forming analog and/or digital circuits, in which various embodiments of multilayer dielectric structures as described herein may be employed. The semiconductor devices can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of embodiments of the invention.

Although embodiments of the invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor structure, comprising:
a multilayer dielectric structure comprising a stack of dielectric films, wherein the dielectric films comprise at least a first SiCNO (silicon carbon nitride oxide) film and a second SiCNO film;
wherein the first SiCNO film comprises a first composition profile of C, N and O atoms;
wherein the second SiCNO film comprises a second composition profile of C, N and O atoms;
wherein the first and second composition profiles are different; and
wherein a total thickness of the multilayer dielectric structure is about 10 nanometers or less.

2. The semiconductor structure of claim 1, wherein an atomic percentage of O atoms in the first SiCNO film is in a range of about 0% to about 25%, and wherein an atomic percentage of O atoms in the second SiCNO film is in a range of about 5% to about 35%.

3. The semiconductor structure of claim 1, wherein an atomic percentage of C atoms in the first SiCNO film is in a range of about 10% to about 40%, and wherein an atomic percentage of C atoms in the second SiCNO film is in a range of about 0% to about 30%.

4. The semiconductor structure of claim 1, wherein an atomic percentage of N atoms in the first and second SiCNO films differs in a range of about 2% to about 20%.

5. The semiconductor structure of claim 1, wherein multilayer dielectric structure consists only of SiCNO films.

6. The semiconductor structure of claim 1, wherein the dielectric films comprise at least one or more of a SiN film, a SiNO film, a SiCO, a SiCN film, or a combination thereof.

7. The semiconductor structure of claim 1, wherein each dielectric film has a thickness in a range of about 1.0 nanometer to about 5 nanometers.

8. The semiconductor structure of claim 1, wherein the multilayer dielectric structure provides step coverage with a conformality of about 70 percent or greater.

9. The semiconductor structure of claim 1, wherein the multilayer dielectric structure has an effective dielectric constant of about 5.5 or less.

10. A semiconductor structure, comprising:
    a multilayer dielectric structure comprising a stack of dielectric films, wherein the dielectric films comprise at least a first SiCNO (silicon carbon nitride oxide) film and a second SiCNO film;
    wherein the first SiCNO film comprises a first composition profile of C, N and O atoms;
    wherein the second SiCNO film comprises a second composition profile of C, N and O atoms;
    wherein the first and second composition profiles are different; and
    wherein the semiconductor structure comprises a BEOL (back-end-of line) structure comprising a copper damascene wire and an ILD (inter-level dielectric) layer, and wherein the multilayer dielectric structure comprises a capping layer that is disposed between the ILD layer and the copper damascene wire.

11. The semiconductor structure of claim 1, wherein the semiconductor structure comprises a transistor device, and wherein the multilayer dielectric structure comprises a stress liner layer that is conformally formed over the transistor device to impart a tensile or compressive stress.

12. The semiconductor structure of claim 1, wherein the semiconductor structure comprises a trench isolation structure formed in a semiconductor substrate, and wherein the multilayer dielectric structure comprises a liner or barrier layer conformally formed on a sidewall and bottom surface of an etched trench of the trench isolation structure.

13. The semiconductor structure of claim 1, wherein the semiconductor structure comprises a through-silicon via (TSV) structure formed in a semiconductor substrate, and wherein the multilayer dielectric structure comprises a liner or barrier layer of the TSV structure.

14. An integrated circuit device comprising the semiconductor structure as recited in claim 1.

15. The semiconductor structure of claim 1, wherein the semiconductor structure comprises a transistor device, and wherein the multilayer dielectric structure comprises a spacer formed on a sidewall of a gate structure of the transistor device.

* * * * *